United States Patent [19]
Lu et al.

[11] Patent Number: 5,776,651
[45] Date of Patent: Jul. 7, 1998

[54] LAMINABLE PROOFING ELEMENTS

[75] Inventors: Ying-Yuh Lu, Woodbury; Bruce W. Weeks, Lake Elmo; Paul J. Wang, Woodbury, all of Minn.

[73] Assignee: Minnesota Mining & Manufacturing Company, St. Paul, Minn.

[21] Appl. No.: 594,162

[22] Filed: Jan. 31, 1996

[51] Int. Cl.$^6$ .................................................. G03C 5/18
[52] U.S. Cl. ........................... 430/143; 430/259; 430/293; 523/201
[58] Field of Search .................. 430/143, 259, 430/293; 523/201

[56] References Cited

U.S. PATENT DOCUMENTS

| | | |
|---|---|---|
| 4,091,162 | 5/1978 | Henderson et al. |
| 4,260,673 | 4/1981 | Krech. |
| 4,304,923 | 12/1981 | Rousseau. |
| 4,656,114 | 4/1987 | Cederberg et al. |
| 4,683,269 | 7/1987 | Aksman. |
| 4,710,525 | 12/1987 | Kraemer et al. |
| 4,889,787 | 12/1989 | Musser. |
| 4,948,822 | 8/1990 | Iovine et al. |
| 5,021,469 | 6/1991 | Langerbeins et al. |
| 5,176,973 | 1/1993 | Gifford et al. |
| 5,185,387 | 2/1993 | Klesse et al. |
| 5,246,981 | 9/1993 | Kawamoto et al. |
| 5,248,583 | 9/1993 | Lundquist et al. |
| 5,403,894 | 4/1995 | Tsai et al. |
| 5,500,457 | 3/1996 | Sarkar et al. ............... 523/201 |
| 5,556,922 | 9/1996 | Mueller et al. |

FOREIGN PATENT DOCUMENTS

| | | |
|---|---|---|
| 1 192 688 | 8/1985 | Canada. |
| 308 735 | 3/1989 | European Pat. Off. |
| 614919 A1 | 8/1994 | European Pat. Off. |
| J1004681 | 1/1989 | Japan. |
| 5301932 | 11/1993 | Japan. |
| 7126595 | 5/1995 | Japan. |
| 7224144 | 8/1995 | Japan. |
| 8100162 | 4/1996 | Japan. |
| WO 94/22674 | 10/1994 | WIPO. |
| WO 94/25499 | 11/1994 | WIPO. |

*Primary Examiner*—Mark Chapman

[57] ABSTRACT

This application discloses a core/shell latex thermal adhesive comprising a thermally softenable polymeric shell having a Tg of greater than 20°C., and a thermally softenable, crosslinked polymeric core having a Tg of less than 20° C., the difference between the Tg of the core and the shell being at least 10°C. This application also discloses a thermally activated adhesive composition comprising:

a) from about 50 to 100 parts of a transparent film-forming core/shell latex polymer, wherein the ratio of core to shell of said core/shell latex polymer ranges from about 20/80 to about 80/20, the shell having a Tg above 20° C. and the core having a Tg below 20° C. with the core having a Tg lower than the Tg of the shell by at least 10° C.;

b) from about 0 to about 15 parts inorganic, wax or polymeric particles;

c) from zero to about fifteen percent of optical brightening agents;

d) from zero to fifteen percent ultraviolet radiation absorbers;

e) and from 0 to 40% by weight non-core-shell polymeric latex, the total of b), c), d), and e) being less than fifty percent.

12 Claims, No Drawings

LAMINABLE PROOFING ELEMENTS

BACKGROUND OF THE INVENTION

1. Field of the Invention

The present invention relates to proofing elements for the printing and publishing industry and the use of thermal adhesive layers to secure proof elements together. The invention uses a transparent film-forming core-shell latex thermal adhesives to provide a thermal adhesive layer when the core-shell latex adhesive is coated onto either positive or negative acting proofing elements.

2. Background of the Art

In printing pictoral or informational content material, whether by lithography, letterpress or gravure printing, the half tone process is used. The actual printing image in the half tone process is composed of thousands of minute dots per square inch. Three or four different color dots are normally used (cyan, magenta, yellow and black), and the dots vary in size to effect variations in image density. What the naked eye sees as shading in half tone prints is actually the controlled variation in the size of the dots relative to the unprinted areas between the dots. Black-and-white print uses only black ink, but full color images in printing are printed in at least three colors (usually cyan, magenta and yellow) and black is often added in a four color process. Each of the colors is separately printed onto a single page in registration to make the final image. To create the individual printing plates for each of the three or four color components, the original image is broken down into the three or four color components (the individual color content images, whether in physical or data form are called "color separations") by masks, filters or other means. Each color separation must contain complete information on the dot-by-dot color content of the original image. It used to be necessary in the printing industry to create a 'proof' of the final printed image (a test run) by creation of the three or four individual separation plates, placing them-on press and actually running the press to determine if the final image met the desired requirements of the customer and/or printer. This was a time consuming and expensive process.

Photomechanical proofing systems have been commercially available for many years. These systems take the original separation information (in the form of black-and-white masks or negatives, or in the form of separate electronic color-by-color files) and use that information to expose and image individual color proofing elements. These individual proofing elements attempt to anticipate the image that would be produced with printing plates on press using the color separation information. By using the color separation information to generate a reliable anticipatory proof without shutting down the press for actual test runs, both time and money is saved. The difficulty is in providing a physical medium which is cat.able of accurately predicting the behavior of the image data in producing a printing plate and in producing the image on press. Numerous systems have been commercialized to provide proofing elements.

One system for proofing color separation negatives is disclosed in U.S. Pat. No. 3,136,637. A light-sensitive transparent sheet is provided for each of the colors to be printed. Each of the sheets is exposed through its respective color separation negative. Upon processing, the color in the non-image areas is removed, yielding a sheet which contains the desired color pattern in the image areas (between half tone dots). After each of the separate sheets is made, they are assembled together in registry on a white background to provide a full color proof.

U.S. Pat. No. 3,671,236 provides an improved version of the proofing element described in U.S. Pat. No. 3,136,637. In this system, photomechanically produced images corresponding to each color are built up, one at a time, on a single substrate (much as occurs in the actual printing process). The individual color proof sheets comprise (1) a carrier sheet with a release layer, (2) pigment and binder layer, (3) photohardenable or photoinsolubilizable layer, (4) barrier layer, and (5) pressure-sensitive adhesive layer. In commercial practice and subsequent patent literature, the pressure-sensitive adhesive layer has been replaced with a thermal adhesive layer. This construction is described, for example, in U.S. Pat. No. 4,656,114.

Positive-acting proofing systems are described for example in U.S. Pat. No. 5,176,973. This type of proofing system may comprise a structure such as a base, a positive-acting photosensitive layer (which becomes more readily removed or developable where actinic radiation strikes the element in an imagewise distribution), a color containing layer (which may be combinable with the photosensitive layer or may itself be a distinct photosensitive layer interacting with the first photosensitive layer), and an adhesive layer. Optional barrier layers may also be present. Various ordering of these layers may be used depending upon the individual properties of the materials and layers and the particular process by which the element is to be imaged and manipulated.

U.S. Pat. No. 4,889,787 describes a commercial positive-acting proofing element with a thermal adhesive layer.

U.S. Pats. 5,026,782 and 5,147,940 disclose opaque polymer particles comprising a non-swellable core polymer, covered at least in part, by a shell polymer. The core polymer can be made of vinyl halide with a Tg of at least 50° C. The polymer is disclosed for use in the manufacture of paints, paper coatings and films, and especially latex binder compositions.

U.S. Pat. 5,216,044 discloses a synthetic resin emulsion with solid core-shell polymer particles having a diameter of from 0.1 to 5.0 µm which spontaneously become porous in a dry state. A process for producing the synthetic resin emulsion comprises the step of preparing the core particles, e.g., by emulsion polymerization of an acrylate ester with another monomer copolymerizable therewith, and then forming a shell of polymer which is more resistant to hydrolysis than the internal core particle. The fine polymer particles of this synthetic resin emulsion save weight and improve hardness, abrasion resistance and thermal resistance. The particle can also be used for an additive to various compositions, paper, metals, plastics, fibers and cloth.

U.S. Pat. 5,254,403 discloses a recording sheet having a substrate and an image receiving layer comprising a mixture of a latex-forming polymer, a polysaccharide and a polymer containing oxyalkylene monomers. The recording sheets are disclosed to exhibit high optical density, minimum intercolor bleeding, and minimum blocking at 50% to 80% humidity and temperatures of over 50° C.

U.S. Pat. 4,497,917 discloses a latex composition comprising core-shell polymer particles where the core has a Tg greater than 70° C. and the shell has a Tg of from 25° C. to 60° C. Because of the relatively low Tg shell, the particles can coalesce sufficiently to form continuous layers under the conditions usually employed to form coatings on photographic film bases and layers. Preferred latex compositions comprise core polymers of 80% to 95% polymerized α,β-ethylenically unsaturated monomer, and shell polymers also of polymerized α,β-ethylenically unsaturated monomers.

SUMMARY OF THE INVENTION

The present invention relates to a) novel thermal adhesive layers formed from transparent film-forming thermally activated core-shell latex adhesive compositions, b) positive-acting or negative-acting photosensitive proofing elements having a thermally activated core-shell latex adhesives coated thereon, and c) these proofing elements where the adhesive layer which comprises a thermally activated core-shell latex adhesive layer (comprising a continuous phase formed from the shell and a dispersed phase formed from the core of the core shell latex adhesive) further comprises UV absorbers and/or optical brighteners. The proofing elements comprise a substrate, a photosensitive layer (positive or negative), a color-containing or color treatable layer (which may be the same or different from the photosensitive layer), optional barrier layers, and an adhesive layer comprising thermally activated core-shell latex adhesive. The use of the adhesive layer derived from the core-shell latex adhesive improves flexibility, controls blocking properties, and prevents or reduces edge welding when stacks of the photosensitive elements are cut or converted.

DETAILED DESCRIPTION OF THE INVENTION

The present invention describes novel adhesive compositions and proofing elements made from those adhesives. The proofing element comprises at least a substrate having a photosensitive layer(s) which can provide differentiable color areas, and an adhesive layer. The term "a photosensitive layer(s) which can provide differentiable color areas" is used to define the known types of photosensitive media which are presently used to provide accurate color renditions in proofing processes. These types of known media and processes include negative acting resist-developable layer (s), negative acting phototackifiable layer(s), positive acting resist-developable layers, and positive acting photodetackifiable layer(s). The term "layer(s)" indicates that the 'layer' may comprise one or more layers, usually only one or two layers.

The present invention describes novel heat activated transparent film forming core-shell latex adhesive compositions wherein the core of the adhesive contains a crosslinked α,β-ethylenically unsaturated monomer(s) and the shell of the adhesive contains copolymer of α,β-ethylenically unsaturated monomer(s) and polar monomer. The term "transparent film forming adhesive" means that the film formed from the adhesive is transparent, not that the composition is transparent. The invention also provides a negative acting or positive acting photosensitive color proofing element which negative acting proofing element may, for example, comprise a carrier having coated thereon a photosensitive color coating comprising: i) a photopolymerizable oligomer comprising an alkyl vinyl- or aryl vinyl- maleic anhydride partial-ester copolymer having a plurality of pendant ethylenically unsaturated groups, an acid number of 100 to 250 and a number average molecular weight of 1,000 to 20,000, ii) a photopolymerizable compound having a plurality of pendant ethylenically unsaturated polymerizable groups and a weight average molecular weight of 400 to 1,500, iii) a colorant, and iv) a photoinitiator. Each of the colored elements are exposed to actinic radiation through a corresponding color separation film to produce a latent image. The latent image is formed by imagewise crosslinking of the exposed photosensitive color coating. When the imaged element is developed with an aqueous alkali developer, the unexposed areas of the photosensitive coating is removed and the cross-linked image remains on the carrier. The imaged elements are then overlaid upon each other in register to form a composite multi-colored proof which may be mounted on any receptor.

In the preferred embodiment, the carrier is a dimensionally and chemically stable plastic sheet, usually 1.5 to 5.0 mil, more preferably a 2.0 to 3.0 mil (5.1 to 7.6 micrometers) polyester film. To assist in the handling of the films, it may be desirable to include an antistatic coating, such as the antistatic coating comprising a colloidal silica crosslinked with an ambifunctional silane coupling agent described in U.S. Pat. No. 5,344,751. In addition, an anti-reflection coating(s), such as those described in U.S. Pat. Nos. 4,340, 276; 4,634,652; and 4,748,101, may also be included in the construction.

The preferred embodiment provides a negative acting single sheet color proofing element comprising, in order: (a) a releasable carrier; (b) a photosensitive color coating comprising; i) a photopolymerizable oligomer comprising an alkyl vinyl- or aryl vinyl- maleic anhydride partial-ester copolymer having a plurality of pendant ethylenically unsaturated groups, an acid number of 100 to 250 and a number average molecular weight of 1,000 to 20,000, ii) a photopolymerizable compound having a plurality of ethylenically unsaturated pendant polymerizable groups and a weight average molecular weight of 400 to 1,500, iii) a colorant, and iv) a photoinitiator; (c) a photopolymerizable barrier coating; and (d) a thermally activated adhesive formed by coating a core-shell latex adhesive onto said barrier coating according to the present invention.

In yet another embodiment, a negative acting color proofing element is described comprising, in order:

(a) releasable carrier;

(b) a photosensitive color coating comprising:

(i) a photopolymerizable oligomer having the formula;

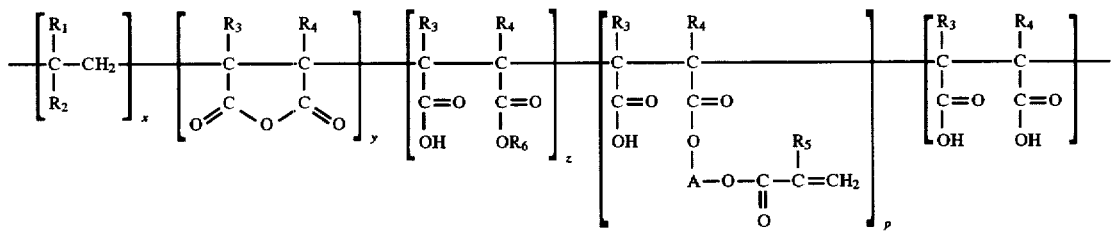

wherein:

$R_1$ and $R_2$ are the same or different groups and are selected from the group consisting essentially of hydrogen, alkyl containing from 1 to 20 carbon atoms, aryl containing from 6 to 10 carbon atoms, alkaryl containing from 7 to 14 carbon atoms, cycloalkyl containing from 4 to 12, and halogen; $R_3$, $R_4$ and $R_5$ are the same or different groups and are selected from the group consisting of hydrogen and alkyl of from 1 to 5 carbon atoms;

$R_6$ is the same or different group selected from the group consisting of hydrogen, alkyl, aralkyl, and alkyl substituted aralkyl groups containing from 1 to 20 carbon atoms, and oxyalkylated derivatives of such groups containing from 2 to 4 carbon atoms in each oxyalkylene group, which group may be from 1 to 20 repeating units;

A is a linear or branched divalent alkylene of from 1 to 20 carbon atoms or an oxyalkylated derivative thereof as described in connection with $R_6$ subscripts x, y, z, m and p are each whole numbers such that the sum of x, y, z, m and p may range from 3 to about 20; x, p and y are each equal to or greater than 1; m may be 0; and z may be 0;

said oligomer having an acid number of 100 to 250 and a number average molecular weight of at least 1,000, preferably 1,000 to 20,000,more preferably 1,000 to 10,000, an (ii) a polymerizable compound having a plurality of pendant ethylenically unsaturated polymerizable groups and a weight average molecular weight of 400 to 1,500;

(iii) a colorant; and (iv) a photoinitiator;

(c) an optional photopolymerizable barrier coating; and (d) a thermally activated adhesive formed by coating a core-shell latex adhesive onto said barrier coating or said photosensitive color composition according to the present invention.

A multicolored image on a single receptor can be obtained by performing the following steps using the aforesaid single sheet photosensitive color proofing element:

(i) laminating a first color proofing element with heat and pressure via the thermal core-shell adhesive to a developer resistant receptor;

(ii) removing the carrier sheet;

(iii) exposing the photosensitive laminated structure through a color separation negative corresponding to the color of the color coating to actinic radiation to crosslink the exposed areas of the photosensitive element and rendering the color and barrier coatings insoluble in an aqueous alkaline developing medium to create a latent image;

(iv) developing the latent image with an aqueous alkaline developing medium whereby unexposed color and barrier coatings are removed and exposed color and barrier coatings remain;

(v) laminating another photosensitive element having a different colorant in the color coating to the developed first photosensitive color proofing element;

(vi) repeating steps (ii)–(iv) with a subsequent separation negative being in register with the developed first photosensitive element; and (vii) repeating steps (v) and (ii)–(iv) in that order with additional photosensitive elements as described above, each of the photosensitive elements being of a different color or visual texture, to provide a multi-colored image on a single substrate.

It is recognized by one skilled in the art that other procedures can be used to obtain a multi-colored image on a single substrate using the aforesaid photosensitive element in the processes described in U.S. Pat. Nos. 4,596,757; 4,650,738; 4,808,508; 4,929,532; 4,937,168; and EP 294,665 and EP 403,128 patent applications.

The construction may optionally include a protective topcoat applied over the photosensitive color coating. In the present invention, the topcoat need not be an oxygen barrier. It may be advantageous, however, to provide an additional coating to impart other desirable properties. For example, this optional topcoat may contain particulates, such as polymeric beads or silica to assist in vacuum draw-down in the exposure frame and improve handling properties, or anti-halation materials to improve resolution, or UV absorbers to balance exposure times of the various colors. The optional topcoat must be capable of being removed during development of the image. Preferred topcoats include water soluble resins, such as alkyl ethers of cellulose, polyvinyl alcohols and polyvinyl pyrrolidone.

Another embodiment of the present invention provides a negative acting single sheet color proofing element comprising in order: a) a carrier having a release surface; b) a photosensitive color coating comprising i) a photopolymerizable oligomer comprising an alkyl vinyl- or aryl vinyl-maleic anhydride partial-ester copolymer having a plurality of pendant ethylenically unsaturated groups and an acid number of 100 to 250 and a number average molecular weight of 1,000 to 20,000, ii) a photopolymerizable compound having a plurality of pendant ethylenically unsaturated polymerizable groups and a weight average molecular weight of 400 to 1,500, iii) a colorant, and iv) a photoinitiator; c) a photopolymerizable barrier coating; and d) a thermally activated adhesive.

The carrier sheet is provided with a release surface which may either be a smooth surface of the carrier itself or a surface release layer thereon. The function of the release surface is to serve as a parting layer between the carrier sheet and the photosensitive color coating layer. The preferred material for use in the present invention is a 1.5 to 2.0 mil (38.1 to 50.8 micrometers) polyester film provided with a release layer comprising a cellulose methyl ether, polyvinylpyrolidone or polyvinyl alcohol resin. The release properties of the release layer may be adjusted by the addition of surfactants. Preferred surfactants include alkylarylpolyether alcohols, such as Triton ™ X- 100 (octylphenoxy ethanol, available from Rohm & Haas, Philadelphia, Pa.), glycerin and ethoxylated castor oil. In the preferred embodiment, the surfactant is present in the release layer at about 0.1 to 5% by weight of solids in the layer, more preferably 0.5 to 2%. Other ingredients may be added such as mold inhibitors, anti-halation dyes, filter dyes, solvents, wetting agents, etc.

A photosensitive color layer is coated onto the releasable surface of the carrier. This layer typically comprises a photopolymerizable oligomer based on an alkyl vinyl- or aryl vinyl- maleic anhydride partial-ester copolymer having a plurality of pendant ethylenically unsaturated groups, an optional photopolymerizable compound having a plurality of pendant ethylenically unsaturated groups, an optional acidic binder, a colorant and a photoinitiator system. The formulation is balanced such that highlight halftone dots are retained at short exposure times while maintaining a clean background in the non-imaged areas.

The addition of a photopolymerizable oligomer based on an alkyl vinyl- or aryl vinyl- maleic anhydride partial-ester copolymer having pendant ethylenically unsaturated groups has a significant effect on both dot retention and background clean-out. The acid functionality of the oligomer assists in providing better adhesion of the imaged or cured photosensitive color layer in combination with the underlying adhesive layer with or without the photopolymerizable barrier.

The molecular weight and acid functionality of the oligomer also play a significant role in the solubility of the cured and uncured portions of the photosensitive color layer. If the molecular weight is too low and/or the acid functionality too high, then the imaged or cured portion of the photosensitive layer may be attacked by the developer resulting in density loss, uneven development around the fringes of the halftone dots, or complete loss of the highlight dots. On the other hand, if the molecular weight is too high and/or the acid functionality too low, then the non-imaged portions of the photosensitive layer may not be removed by the developer, resulting in loss of resolution in the shadow areas of the proof (90–99.5% dots) or background staining. The strength of the developer can be increased in this particular situation to assist in the removal of the layer; however, this may lead to loss of the highlight dots. It is well know in the art that if the alkyl vinyl-maleic anhydride copolymers are used as compared to the aryl vinyl-maleic anhydride copolymers, then a higher molecular weight material may be desired. Suitable acrylated or methacrylated alkyl vinyl- or aryl vinyl- maleic anhydride partial-ester copolymers have an acid number between about 100 and 250 and a number average molecular weight of at least 1,000, preferably between 1,000 and 20,000, more preferably between 1,000 and 10,000 and most preferably between 1,000 and 5,000. Examples of commercially available materials from Sartomer Co. Inc., Exton, Pa. include Sarbox™ 401 (methacrylated styrene/maleic partial-ester copolymer having an acid number of 145±15 and a number average molecular weight of 2,500) and PRO™ 884 (acrylated styrene/maleic anhydride partial-ester copolymer having an acid number of about 200 and a number average molecular weight of 2,000). These materials are generally described in U.S. Pat. Nos. 4,745,138 and 4,722,947 and have the following general formula:

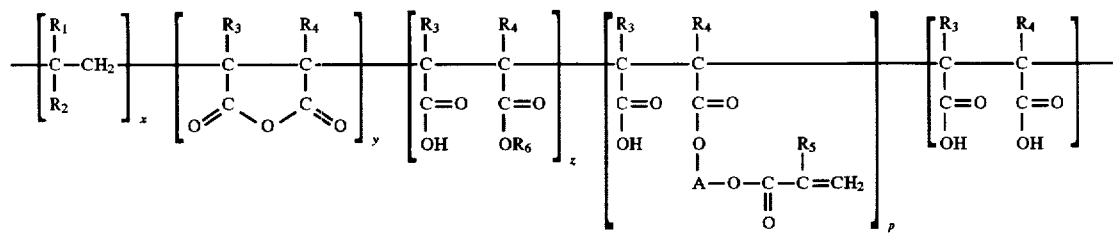

wherein:

$R_1$ and $R_2$ are selected from the group consisting essentially of hydrogen, alkyl containing from 1 to 20 carbon atoms, aryl containing from 6 to 10 carbons atoms, alkaryl containing from 7 to 14 carbon atoms, cycloalkyl containing from 4 to 12, preferably 4 to 6 carbon atoms, and halogen such as chlorine, fluorine or bromine. $R_1$ and $R_2$ may be the same or different and preferably are each independently hydrogen, methyl, phenyl, benzyl, or cycloalkyl of 4 to 6 carbon atoms.

The groups $R_3$, $R_4$ and $R_5$ are the same or different groups and are selected from the group consisting of hydrogen and alkyl of from 1 to 5 carbon atoms, and preferably are each independently hydrogen and/or methyl.

The group $R_6$ is the same or different group selected from the group consisting of hydrogen, alkyl, aralkyl, and alkyl substituted aralkyl groups containing from 1 to 20 carbon atoms, and oxyalkylated derivatives of such groups containing from 2 to 4 carbon atoms in each oxyalkylene group, which group may be from 1 to 20 repeating units, preferably 1 to 6 repeating units; and the group A is a linear or branched divalent alkylene of from 1 to 20 carbon atoms or an oxyalkylated derivative thereof as described in connection with $R_6$.

Subscripts x, y, z, m and p are each whole numbers such that the sum of x, y, z, m and p may range from 3 to about 20; x, p and y are each equal to or greater than 1; and z and/or m may be 0; preferably x is equal to 3 to 20, as well as to the sum of y, z, m and p. The copolymer has an acrylate equivalent per gram value of at least 0.1, preferably between 1 and 2.

Polymers described in U.S. Pats. Nos. 5,248,583 and 5,374,501 may also be used for these materials.

In the present invention, a preferred copolymer is when $R_1$ is a hydrogen and $R_2$ is a phenyl group. Unlike most other acrylated or methacrylated oligomers, the Sarbox™ 401 and PRO™ 884 may be formulated with a pigment milibase and photoinitiator to afford a non-tacky photosensitive color layer. The reduction in tack provides easier manufacturing of the elements. Tacky coatings have a tendency to pick-up dirt or the color coating transfers to face-side rollers in the coating and drying process during the manufacturing of the proofing elements.

The photosensitive color layer may also include non-acidic materials to adjust the developability of the layer depending upon the strength of the developer. It is sometimes advantageous to increase the strength of the developer slightly to formulate a more robust film. This will provide more latitude when the proofing elements are subjected to the mechanical action of brushes or developing pads in an automated processing apparatus. The preferred materials for adjusting developability include photopolymerizable compounds having a plurality of pendant ethylenically unsaturated polymerizable groups, such as photopolymerizable polymers, oligomers or monomers having a weight average molecular weight of about 400 to 1,500 and at least 2 pendant ethylenically unsaturated polymerizable groups, more preferably at least 4 pendant ethylenically unsaturated polymerizable groups. Examples of suitable ethylenically unsaturated polymerizable groups include acryloyl, methacryloyl and acrylamido groups. Suitable polymers, oligomers or monomers are well known in the art and non-exclusively include materials such as novolac acrylate resins (i.e., Echo™ 310, available from Echo Resins and Laboratory, Versailles, Mo.), acrylate or methacrylate esters of polyols, (i.e., polybutane diol diacrylate, dipentaerythritol pentaacrylate, pentaerythritol tetraacrylate and triacrylate, pentaerythritol tetramethacrylate and trimethacrylate, hydantoin hexaacrylate, and tetrahydrofurfiurylmethacrylate), acrylated or methacrylated urethane oligomers (i.e., Ebecryl™ 220, hexaacrylate urethane oligomer, available from UCB Radcure Inc., Louisville, Ky.), and acrylamides (i.e., diacetone acrylamide and acrylamidoethyl methacrylate). The composition of the polymer, oligomer or monomer backbone is not critical as long as it does not impart visible color shifts (less than 1 delta E measured spectrophotometrically with a Gretag SPM spectrophotometer) in the photosensitive color layer during the imaging process or upon natural aging (90 days at ambient temperature). A preferred photopolymerizable compound has no acid functional groups or weakly acidic groups, such as phenolic groups.

A balance is maintained between the acid functionality, the polymerizable functionality and the strength of the developing medium to optimize the resolution and latitude of the final imaged proofing element. The best resolution is achieved when an aqueous developer is used having a pH of about 10 to 11, preferably 10 to 10.5 and the acid number of the photosensitive layer is adjusted to about 30 to 75, more preferred 40 to 60 and most preferred 45 to 55. The preferred weight percentage of polymerizable materials present in the photosensitive layer is 20 to 80% and most preferred is 40 to 60%.

In the preferred embodiment, the photoinitiator(s) used must not generate a visible color change in the image or adhesive layers after exposure. Examples of photoinitiators non-exclusively include; triazines, acetophenones, benzophenones, and thioxanthones. The preferred photoinitiators include Irgacure™ 907 (2-methyl-1-(4-(methylthio) phenyl)-2-(4-morpholinyl)-1-propane) available from Ciba Geigy Corp., Hawthorne, NY), Irgacure™ 369 (2-benzyl-2-(dimethylamine)-1-4-(r-morpholinylphenyl)-1-butanone, available from Ciba Geigy Corp., Hawthorne, NY.), Speedcure™ ITX (isopropylthioxanthone, available from Aceto Chemical Co. Inc., Flushing, N.Y.) and triazines tethered to alkylarylpolyether alcohols as described in U.S. Pat. No. 5,298,361. The initiators may be used singly or in combination with each other. The optimum amount of initiator will be dependent upon the oligomer type used and the filtering effect of the pigment used; however, the initiator is usually present in concentrations of about 1.0–15% by weight of the photosensitive composition.

Pigments or dyes may be used as colorants in the photosensitive color layer. However, pigments or polymeric dyes are preferred since they have a lower tendency for migration between the layers. Pigments are more preferred due to the wide variety of colors available and lower cost. Pigments are generally introduced into the photosensitive formulation in the form of a millbase comprising the pigment dispersed with a binder and suspended into a solvent or mixture of solvents. The dispersion process may be accomplished by a variety of methods well known in the art, such as two-roll milling, three-roll milling, sand milling, ball milling, etc. Many different pigments are available and are well known in the art. The pigment type and color are chosen such that the coated color proofing element is matched to a preset color target or specification set by the industry. Color enhancing additives may be used which include fluorescent, pearlescent, iridescent, and metallic materials. Materials such as silica, polymeric beads, reflective and non-reflective glass beads, or mica may also be added in place of a colorant to provide a textured image. The color enhancing additives or texturing materials may be used either alone or in combination with the above pigments to produce proofs with the desired visual effects.

The type of dispersing resin and the pigment to resin composition ratio chosen are dependent upon the pigment type, surface treatment on the pigment, dispersing solvent and milling process. Some examples of resins suitable for generating millbases which are compatible with the aforementioned photo-oligomers and monomers include; polyvinyl acetate/crotonic acid copolymers, styrene/maleic anhydride partial-ester resins, acid containing acrylic and methacrylic polymers and copolymers, polyvinyl acetals, polyvinyl acetals modified with anhydrides and amines, hydroxy alkyl cellulose resins and styrene/acrylic/acrylic acid resins. The dispersion may contain a mixture of these resins. The pigment to resin ratio in the dispersion is typically between 0.6 to 5.0, preferably between 0.8 to 3.0.

A dispersing agent may be necessary to achieve optimum dispersion quality. Some examples of dispersing agents include; polyester/polyamine copolymers, alkylarylpolyether alcohols, acrylic resins and Disperbyk™ wetting agents available from Byk-Chemie USA, Wallingford, Conn. Other components may also be included in the millbase such as surfactants to improve solution stability, fluorescent materials, optical brighteners, UV absorbers, fillers, etc.

The preferred composition of the millbase solids comprises about 30–71% by weight pigment, 15–30% by weight acidic resin, 0–25% non-acidic resin, and 0–20%, more preferably 0–10% by weight dispersing agents. Additional binders may also be included in the photosensitive color formulation to balance developability and tack for each color. The coating weights of the individual colors may vary in order to achieve the preset color target. The color formulations are adjusted to achieve optimum color, resolution, exposure speed and developability. Typical dry color coating weights are between 50 mg/ft$^2$ and 150 mg/ft$^2$ (0.54 g/m$^2$ and 1.61 g/m$^2$), preferred 60 mg/ft$^2$ and 90 mg/ft$^2$ (0.65 g/m$^2$ and 0.97 g/m$^2$).

Coated adjacent to the photosensitive color layer is the photopolymerizable barrier layer. The photopolymerizable barrier layer is present to prevent interaction between the color layer and the adhesive, and also improves developability of the non-image areas. The barrier layer typically comprises an photopolymerizable ethylenically unsaturated compound, an acidic binder and a photoinitiator. Preferred examples of ethylenically unsaturated compounds include acrylated epoxy oligomers, acrylated urethane oligomers as described in U.S. Pat. No. 4,304,923, Echo™ TAE 310 (triacrylated aromatic epoxide available from Echo Resins and Laboratory, Versailles, Mo.) and Dynacoll™ A 6083 (acrylated copolyester available from Huls America, Piscataway, N.J.). The ethylenically unsaturated compound is present at about 50–65% by weight of the total barrier composition. Preferred binders include; polyvinyl acetate/ crotonic acid copolymers, styrene/maleic anhydride partial-ester resins, acid containing acrylic and methacrylic polymers and copolymers, acidified polyvinyl acetals, and styrene/acrylic/acrylic acid resins. The acidic binder or resin is present at about 30–50% by weight of the total barrier composition. Preferred photoinitiators include; Irgacure™ 907, Speedcure™ ITX and triazines tethered to alkylarylpolyether alcohols. The initiator is present at 0–10% by weight of the total barrier composition. The addition of photoinitiator may be unnecessary depending upon the extent upon which the barrier layer intermixes with the adjacent photosensitive color layer. The barrier layer is coated to a dry coating weight of about 0.15 to 2.0 g/m$^2$, preferably about 0.2 to 1.0 g/m$^2$.

In the preferred embodiment, the barrier layer coating is applied and dried such that the photosensitive color layer and barrier layer become intermixed. The solvent interacts with the photosensitive color layer so that mixing at the interface may occur, but does not penetrate, swell or dissolve the photosensitive color layer to the extent that it destroys the uniformity of the color layer or interferes with the releaseablility of the coatings from the carrier. The photosensitive color layer and barrier may intermix to the extent that the layers are indistinguishable by SEM (scanning electron microscope). In other words, the layers for all practical purposes perform as one layer instead of two distinct layers and there is no observable absolute and sharp separation of materials at the interface between the two layers. Suitable solvents include ketones, ethers, alcohols, chlorinated alkanes, aromatics and esters (i.e., methyl ethyl ketone, methyl isobutyl ketone, trichloroethylene, propanol, ethyl acetate, tetrahydrofuran, propylene glycol monomethyl ether and toluene).

Coated adjacent to the photopolymerizable barrier layer is the adhesive layer. The adhesive layer provides a means of laminating the color proofing element to a temporary or permanent substrate under heat and pressure. The solvent used for this coating must not attack or interact with the coatings present on the carrier. Examples of solvents include alcohols, water and hydrocarbon solvents. Because hydrocarbon solvents like heptane and naphtha are prone to irregular coating patterns, due primarily to static, more polar solvents such as water and alcohols are preferred. The adhesive is preferably a thermally activated adhesive that is able to adhere to a primed polyester base or plain paper at a temperature of less than 150° C., preferably within a range between 60° C. and 140° C., and most preferably between 75 and 110 degrees Centigrade. In contrast with the softening characteristics of the adhesive it is desirable that the adhesive not block during storage or shipment. Resins having a Tg between 25° C. and 100° C., including copolymers and terpolymers of alkyl acrylate, alkyl methacrylate, styryl, and acrylamide monomers, meet both the lamination criteria and avoid the potential for blocking, without requiring the use of an additional protective liner. However, the acrylic resins with Tg>25° C. are, in general, brittle.

The invention provides a preferred thermally activated adhesive comprising:

a layer formed by the coating out of a core-shell transparent film forming latex thermal adhesive composition in which the core has a Tg less than 20° C. and the shell has a Tg greater than 20° C., and the difference between the Tg of the core and the shell is at least 10° C.

When coated out, the adhesive layer forms a layer comprising a dispersed phase of the core polymer (having the Tg less than 20° C.) and a continuous phase from the shell polymer (having a Tg greater than 20° C.). Even though the shell has a higher Tg, it has been determined that the shell forms the continuous phase and the core forms the dispersed phase.

The preferred thermally activated adhesive coating composition comprises:

a) from about 50 to about 99 or 100 parts of a transparent film-forming core/shell latex adhesive, wherein the ratio of core to shell of said core/shell latex polymer ranges from about 20/80 to about 80/20, with the core having a lower Tg than the shell (preferably from 30/70–70/30 and more preferably from 40/60–60/40);

b) from about 0 to about 15 parts inorganic, wax or polymeric particles;

c) from zero to about fifteen percent of optical brightening agents;

d) from zero to fifteen percent ultraviolet radiation absorbers;

e) and from 0 to 40% by weight non-core-shell polymeric latex.

Preferably the total of b), c), d), and e) is less than fifty percent, more preferably less than forty percent, and most preferably less than thirty percent by total weight of the adhesive layer. The negative acting systems of the present invention tend to prefer lower amounts of additives than the positive acting systems.

Preferred transparent film-forming core/shell latex adhesive of the present invention comprise:

1) a core formed from:
   i) about 90 to 100 parts of at least one α, β-ethylenically unsaturated monomer having from about 1 to about 12 carbon atoms;
   ii) 0 to about 10 parts of at least one polyethylenically unsaturated crosslinking monomer; and 2) a shell formed from:
   i) about 85 to 99 parts of at least one α, β-ethylenically unsaturated monomer having from about 1 to about 12 carbon atoms; and
   ii) 1 to about 15 parts of at least one polar monomer.

It is preferred that the core have a Tg of less than 20° C. and that the shell have a Tg of greater than 20° C., with a difference of at least 10 degrees between the core and shell Tg's, with the shell Tg always being the higher of the two.

These terms as used herein have the following meanings.

1. The term "core/shell latex polymer" means a polymer particle wherein each discrete particle has a core surrounded by a shell. The core polymer usually has one Tg and the polymer of the shell usually has a Tg which is higher than the Tg of the core polymer.

2. The terms (meth)acrylic, (meth)acrylate and the like mean that both the methacrylic and acrylic versions of the equivalent are included in the group defined.

3. The term "layer(s)" means a single layer or two layers which together provide a specific combination of functions. For example, a color containing photosensitive layer(s) may be a single layer which is both photosensitive and contains the color providing material (e.g., pigment or dye) or a combination of two layers, at least one being photosensitive and the other at least containing a color providing material. Each layer in a two layer color photosensitive layer(s) may contain both ingredients, the color material and the photosensitive ingredients.

Al parts, percents, and ratios herein are by weight unless specifically stated otherwise.

Water-based compositions of the invention comprise a transparent film forming core/shell latex adhesive, wherein the ratio of core to shell of said core/shell latex polymer ranges from about 20/80 to about 80/20, preferably from about 30/70 to about 70/30, more preferably from about 40/60 to about 60/40. The core polymer has a lower Tg than the shell. The Tg of the core is less than about 20° C., preferably ranges from about −5° C. to about 15° C., more preferably from about −2° C. to about 10° C. When Tg of the core gets above 20° C., the core/shell latex adhesive becomes too brittle. The adhesive coated proofing element is easy to crack. The Tg of the shell is greater than 20° C., preferably ranges from about 30° to about 100° C., more preferably, from about 35° to about 65° C. When Tg of the shell gets below 20° C., the composition becomes too soft, and has blocking problems, particularly in high temperature and/or high humidity. A typical symptom of blocking problems is difficulty in separating adjacent transparent sheets of a stack. On the other hand, when Tg gets above 100° C., the lamination adhesion is lower than desired. The Tg of the shell and the core may be adjusted by the addition of small amounts of crosslinking agents into the respective compositions. The addition of the crosslinking agent into the composition of the core provides a critical ability to eliminate the problem of edge-welding, discovered in attempts to practice the present invention. The use of crosslinking agents in the shell assists in reducing blocking in stacked photosensitive elements of the present invention.

The presence of the core appears to allow the use of a shell having a higher Tg than normally possible without significant loss of flexibility. It is believed that the lower Tg core material allows the overall latex polymer in the dried film state to perform as a high impact resistant composite and capable of absorbing applied stresses. This effect can be readily measured using a wedgie test.

In the present invention, the more compliant core/shell latex adhesive allows for increased flexibility in the proofing element, and greater conformity in the element. The core is preferably made from at least one α,β-ethylenically unsaturated monomer having from about 1 to about 12 carbon atoms. This monomer makes up from about 90 to 100 parts, preferably from about 93 to about 99.9 parts, more preferably from about 93 to about 98 parts of the core. The core also contains 0 to about 10 parts by weight of at least one polyethylenically unsaturated crosslinking monomer, preferably from about 0. 1 to about 8 parts by weight, more preferably from about 2 to about 7 parts by weight of the core.

The shell is likewise formed from about 85 to about 99 parts, preferably from about 90 to about 98 parts, more preferably from about 92 to about 98 parts by weight of at least one α,β-ethylenically unsaturated monomer containing from about 1 to about 12 carbon atoms and a polar monomer. The polar monomer makes up from about 1 to about 15 parts, preferably from about 2 to about 10, more preferably from about 2 to about 8 parts by weight of the shell polymer.

The most useful α, β-ethylenically unsaturated monomers include, but are not limited to, methyl acrylate, ethyl acrylate, methyl (meth)acrylate, isobutyl (meth)acrylate, isodecyl (meth)acrylate, cyclohexyl (meth)acrylate, n-butyl acrylate, styrene, vinyl esters, and the like. Preferred monomers include methyl (meth)acrylate, and ethyl (meth)acrylate.

The most useful polar monomers are selected from the group consisting of acrylic (meth)acrylic acid or hydroxyalkyl(meth)acrylates; and nitrogen-containing compounds including N-alkylacrylamide, N,N-dialkyl amino monoalkyl (meth)acrylate, N-alkyl amino alkyl (meth) acrylate, N-methylolacrylamide and isobutoxymethacrylamide, all said above alkyl groups having up to 8 carbon atoms, preferably up to 2 carbon atoms.

Preferred polar monomers include hydroxyethylacrylate and methacrylate, N-methylacrylamide, n-butylmethacrylamide, N-methylolacrylamide, isobutoxymethacrylamide, N-butylaminoethyl(meth)acrylate, N,N'-diethylaminoethyl (meth)acrylate, N,N'-dimethyl aminoethyl(meth)acrylate, and N,N'-dimethyl acrylamide.

When these polar monomers are present in the shell polymer, the shell polymer is preferably crosslinked. Some of the polar monomers, e.g., n-methylolacrylamide and isobutoxy methacrylamide can undergo self-crosslinking during the drying stage. while others required an additional crosslinker to be present. Useful crosslinkers include polyfunctional aziridines such as trimethylolpropane-tris-(β-(N-Aziridinyl)propionate), Pentaerythritol-tris-(β-(N-aziridinyl)propionate), trimethylolpropane-tris-(β-(N-methylaziridinyl)propionate), and the like; ureaformaldehyde, melamine formaldehyde, isocyanate, multifunctional epoxy polymers, alkyldialkoxy silane, γ-aminopropyl trimethoxysilane, vinyl triethoxy silane, vinyl tris(O-methoxy ethoxy)-silane, vinyl triacetoxy silane, y-methacryloxypropyltrimethyoxy silane, γ-(β-amino ethyl) aminopropyl trimethoxysilane, and the like.

Useful polyethylenically unsaturated crosslinking monomers include, but are not limited to, 1,6 Hexandioldiacrylate, divinyl benzene, butanediol diacrylate, polyethylene glycol diacrylate, trimethylolpropane trimethacrylate.

The core/shell latex polymers are polymerized using emulsion polymerization techniques. Such techniques are well known in the art. Emulsion polymerization techniques require the presence of emulsifiers in the polymerization vessel. Useful emulsifiers include those selected from the group consisting of anionic surfactants, nonionic surfactants and mixtures thereof Specific examples can include those whose molecular structure includes at least one hydrophobic moiety selected from the group consisting of from about $C_6$- to about $C_{12}$- alkyl, alkylaryl, and/or alkenyl groups as well as at least one anionic group selected from the group consisting of sulfate, sulfonate, phosphate, polyoxyethylene sulfate, polyoxyethylene sulfonate, polyoxyethylene phosphate, and the like, and the salts of such anionic groups, wherein said salts are selected from the group consisting of alkali metal salts, ammonium salts, tertiary amino salts, and the like.

Representative commercial examples of useful anionic surfactants include sodium lauryl sulfate, available from Stepan Chemical Co. as POLYSTEPT™ B-3; sodium lauryl ether sulfate, available from Stepan Chemical as POLYSTEP™ B-12; and sodium dodecyl benzene sulfonate, available from Rhone-Poulenc as SIPONATE™ DS-10, and sodium isodecyldiphenyloxide disulfonate, available from Dow Co. as DowFax 2A1.

Useful nonionic surfactants include those whose molecular structure comprises a condensation product of an organic aliphatic or alkyl aromatic hydrophobic moiety with a hydrophilic alkylene oxide such as ethylene oxide. The HLB (Hydrophilic-Lipophilic Balance) of useful nonionic surfactants is about 10 or greater, preferably from about 10 to about 20. The HLB of a surfactant is an expression of the balance of the size and strength of the hydrophilic (water-loving or polar) groups and the lipophilic (oil-loving or non-polar) groups of the surfactant. Commercial examples of nonionic surfactants useful in the present invention include nonylphenoxy or octylphenoxy poly(ethyleneoxy) ethanols available from Rhone-Poulenc as the IGEPAL™ CA or CO series, respectively; $C_{11}$–$C_{15}$ secondary-alcohol ethoxylates available from Union Carbide as the TERGITOL™ 15-S series; Surfynol™ surfactants from Air Products Co.; and polyoxyethylene sorbitan fatty acid ester available from ICI Chemicals as the TWEEN™ series of surfactants.

A useful range of emulsifier is from about 1 to about 8 weight percent, preferably from about 1.5 to about 7 percent, and most preferably from about 2 to about 5 weight percent, based on the total weight of all monomers in both the core and the shell of the latex polymer.

Water soluble thermal initiators are also present in the emulsion polymerization of core/shell latex polymers. Suitable ones include those selected from the group consisting of potassium persulfate, ammonium persulfate, sodium persulfate, and mixtures thereof, and oxidation-reduction initiators such as the reaction product of the above-mentioned persulfates and reducing agents such as those selected from the group consisting of sodium metabisulfite and sodium bisulfite. The preferred water-soluble thermal initiators are potassium persulfate and ammonium persulfate. Preferably, most water-soluble initiators are used at temperatures of from about 40° to about 70° C., while the oxidation-reduction-type initiators are preferably used at temperature of from about 25° to about 40° C. Water-soluble thermal initiators comprise from about 0.05 to about 2 parts, preferably about 0.1 to about 0.5 parts based on the total weight of monomers in the emulsion.

Apart from the spherical core/shell latex polymers, other polymeric particles are useful to improve blocking resistance of the coated sheets in the present invention. These can range from about 1, μm to about 15, μm in diameter and can include poly(methylmethacrylate)(PMMA), modified poly (methylmethacrylate), poly(tetrafluorethylene), polyethylene, particles produced from diol di(meth)acrylate homopolymers which impart antifriction characteristics when coated on image recording sheets. These diol di(meth) acrylates can be reacted with long-chain fatty alcohol esters of (meth)acrylic acid. Preferred embodiments contain particles selected from PMMA, modified PMMA, and particles produced from either diol-di(meth)acrylate homopolymers or copolymers of diol di(meth)acrylates and long-chain fatty alcohol esters of (meth)acrylic acid.

Other useful particles include inorganic particles such as silica, polymeric particles such as PA, modified PMMA, polyethylene and tetrafluoropolyethlene, porous organic particles such as ureaformaldehyde, and coated silicas.

Additional wetting agents with HLB values of 2–10 may be present in the emulsion to improve coatability. These additional surfactants are added after polymerization is complete, prior to coating of the polymeric substrate. Preferred additional wetting agents include fluorochemical surfactants such as FC-170C and FC-171, available from 3M. Other useful wetting agents include Surfynol™ SE-F from Air Products Co. and Tetronic 701 ™ from BASF Co., and Triton™ X-100, available from Union Carbide.

Film substrates for use with compositions of the invention may be formed from any polymer capable of forming a self-supporting sheet, e.g., films of cellulose esters such as cellulose triacetate or diacetate, polystyrene, polyamides, vinyl chloride polymers and copolymers, polyolefin and polyallomer polymers and copolymers, polysulphones, polycarbonates, polyesters, and blends thereof Suitable films may be produced from polyesters obtained by condensing one or more dicarboxylic acids or their lower alkyl diesters in which the alkyl group contains up to 6 carbon atoms, e.g., terephthalic acid, isophthalic, phthalic, 2,5-,2,6-and 2,7-naphthalene dicarboxylic acid, succinic acid, sebacic acid, adipic acid, azelaic acid, with one or more glycols such as ethylene glycol, 1,3-propanediol, 1,4-butanediol, and the like. Polyethyleneterephthalate and polyethylenenaphthalate are preferred polymer films in the practice of the present invention.

It is preferred that film backings have a caliper ranging from 38 μm to 150 μm. Film backings having a caliper of less than 38 μm are difficult to handle using conventional methods for graphic materials. Film backings having calipers over 150 μm are very stiff, and present feeding difficulties in certain commercially available machines.

In initial attempts to use core-shell latex adhesives with core Tg below −6° C. in proofing elements, it was noted that when stacks of the elements were converted to appropriate size by cutting, there was blocking, i.e., sticking of the cut elements at the edges. This lowered the ease of use of the elements, caused adherence of the cut sheets, and even caused removal of portions of the functional (e.g., photosensitive) layers from the elements when the stacks were separated. This created significant waste, increased cost and customer dissatisfaction. The phenomenon of adherence of the elements of the stacks after cutting is referred to herein as "edge-welding" because of the fact that the edges of the sheets appear to become welded together by the cutting operation.

The crosslinking agent can be added in amounts which will improve (raise) the viscosity and/or (reduce) tackiness of the core polymer to reduce flow during conversion or cutting of the element, without rendering the core polymer excessively hard and non-flowing when heated for lamination of the proofing element. The amount of crosslinking agent is of course partially dependent upon the specific polymer used in the core (both as to composition, physical properties and molecular weight, but it has been generally found that amounts of crosslinking agent from 0 to 10% by total weight of the polymer in the core comprises the crosslinking agent. The crosslinking can be effected by two distinct types of procedures. The crosslinking agent may be present during the initial polymerization of the core polymer so that a crosslinked polymer is produced in a single step. This is a preferred method. It is also possible to produce a core polymer having pendant groups which are further reactive, such as free hydrogen containing groups (e.g., —OH, —SH, —COOH, etc.) and then adding an at least difunctional material which can react with these pendant groups. The use of a diisocyanate, diacid, diol, aziridine, or the like would be an example of possible crosslinking agents added to the preformed polymer with pendant groups thereon. In all cases, the crosslinking agent is at least difunctional (i.e., it contains at least two moieties or groups on the crosslinking compound which can react with available sites on the polymer or other crosslinking agents which embed themselves in the polymer structure or react with reactivities on the polymer.

An alternative way of describing the physical change which is sought in the core polymer properties is to consider the Tg of the core polymer. The original efforts at using core-shell latex adhesives in proofing elements was with adhesives wherein the Tg of the core was below −6° C. It has been found that the change in crosslinking of the core polymer moves the Tg to about −5 to 15° C., more preferably from −2 to 10°C., and most preferably from 1 to 9° C.

Optical brighteners and UV absorbers may be added to the core and/or shell adhesive compositions. This enables the adhesive layer to act as an antihalation layer during imaging or a brightening layer in the final image. Optical brighteners were known to be used in opaque adhesive layers in non-core-shell thermal adhesive proofing elements. There the optical brighteners were used in an opaque adhesive to attempt to have the opaque adhesive imitate the physical reflective properties of paper bases. Tg of the invented core-shell latex thermal adhesive is determined by the Differential Scanning Calorimeter (DSC). Mid point Tg is used.

EXAMPLES

Background Example 1

An acrylic polymer latex (a dispersion of acrylic polymer in water made by the emulsion polymerization technique) was diluted with water and surfactant added to make a thermal adhesive coating dispersion for Matchprint™ III negative. The formula used is:

| A. | Synthemul 97603 | 13,120 grams |
|----|-----------------|--------------|
| B. | Water, deionized | 2,864 grams |
| C. | Tetronic 701 | 16 grams |
|    |                 | 16,000 grams | solids = 37%

This coating dispersion was mixed with polymethylmethacrylate (PMMA) beads to aid in preventing blocking of the coated sheet onto an adjoining sheet. The final coating dispersion was coated onto MN™ III web which had previously been coated with three layers; 1. PVA release layer. 2. photopolymer color layer, 3. a colorless photopolymer barrier layer. The thermal adhesive layer (4th layer), was coated and dried to give an adhesive layer of 650–700 mg./sq. ft.

Preparation of Core/shell Latex Adhesive for MatchPrint III

The following ingredients were admixed according to the procedures described below to make core/shell latex adhesives of Background Example 2 and Example 1. All charges are by weight unless specified otherwise.

| Ingredient | Background Example 2 | Example 1 |
| --- | --- | --- |
| DI Water | 2060.2 | 2060.2 |
| DowFax 2A1 | 35.9 | 71.8 |
| Core Monomer | | |
| MMA | 80.8 | 161.5 |
| EA | 726.8 | 646.1 |
| HDDA | 0.0 | 24.0 |
| Shell Monomer #1 | | |
| MMA | 452.2 | 452.2 |
| EA | 315.0 | 315.0 |
| Shell Monomer #2 | | |
| NMA | 84.1 | 84.1 |
| DI Water | 211.2 | 211.2 |
| (NH4)2S2O8 | 4.8 | 4.8 |
| NH4OH | 2.1 | 2.1 |
| DI Water | 3.9 | 3.9 |

DowFax 2A1: 45% active in water.
MMA: Methyl Methacrylate
EA: Ethyl Acrylate
NMA: N-Methylol Acrylamide, 48% active in water
HDDA: 1,6 Hexane Diol Diacrylate Procedures:

To prepared the present core/shell latex adhesives of Background Example 2 and Example 1,deionized water and surfactants, Dowfax 2A1, are added into a four-neck flask equipped with a reflux condenser, thermometer, stirrer, metering pumps and a nitrogen gas inlet. The mixture is then stirred and heated to 55° C. under nitrogen atmosphere. During heating up, the core monomers of MMA, EA and HDDA (if used) are charged into the reactor. When the batch temperature levels off at 55° C., the initiator, (NH4)2S2O8, is added into the reactor to initiate the polymerization. The reaction is allowed to exotherm. At the exotherm peak, the shell monomer mixture #1 (MMA and EA mixture) and the shell monomer mixture #2 (NMA and DI Water mixture) are simultaneously fed into the reaction using two metering pumps. The shell monomer feeds are completed for 70 minutes. After the peak temperature, the batch temperature set point is changed to 70° C. for the rest of the polymerization. When the shell monomer feeds are finished, the emulsion is polymerized for another two hours at 70° C. to eliminate residual monomers. The latex is then cooled to room temperature and filtered through a 25 μm filter to remove coagulum. The latex is then ready for application.

Background Example 2.

A core/shell latex with the following composition was made by the procedure described above;

| | MMA | EA | NMA | DSC Tg |
| --- | --- | --- | --- | --- |
| Core | 10 | 90 | 0 | about −6 |
| Shell | 56 | 39 | 5 | about +46 |

The core/shell volume ratio was 50/50.

Standard web off-set press (SWOP)[1] on Matchprint™ III, negative-acting where the thermal acrylic adhesive was replaced by this composition.

[1] SWOP="Recommended Specifications - Web Offset Publications"

This composition was formulated and coated in the same manner as the Background Ex. 1. The results were satisfactory in every way, except during guillotining of the coated film, there was a tendency for the core polymer material to be carried along by the blade and cause sticking of the edges of adjacent sheets. This sticking or "edge welding" can cause the coating to peel from the sheet when separating two sheets which are edge welded together.

Example 1.

The procedure of Background Example 2 was repeated with two changes; the core composition was changed to increase the core Tg. and a cross-linking monomer, hexanediol diacrylate (HDDA), was added to minimize the edge welding problem caused by the tackiness of the core material.

The composition, in parts by weight, of the latex in Ex. 1 is;

| | MMA | EA | HDDA | NMA | DSC Tg °C. |
| --- | --- | --- | --- | --- | --- |
| core | 20 | 80 | 3.0 | — | 3 |
| shell | 56 | 39 | — | 5 | about 42 |

Core/shell volume ratio is 50/50.

This formulation was coated on Negative Matchprint™ III (SWOP) at 700 mg./sq. ft.

TESTING

1. Film Flexibility (Wedgie Test)

A pair of metal plates are arranged in a "Y" or "V" configuration with a narrow slot where the two plates come together. A strip of the coated film is folded into a loop with the coating on the outside of the loop. Both ends are inserted through the narrow slot from the wide end of the test fixture. The bottom end is taped to the test bed and the top end is drawn through the slot at a uniform rate. As the test film is drawn through the test fixture, the radius of the loop of the film continuously decreases. As the film exits the narrow gap, the polyester carrier web is bent to the maximum and takes on a permanent crease. The distance in millimeters from the crease point to the initial start of film cracking (if present) is a measure of film stiffness. Lower numbers indicate increased film flexibility. Also, the extent of damage to the coating at the crease line can be rated on a comparative scale with zero as no damage, to six as maximum damage, including severe flaking of the coating from the polyester carrier web.

2. Edge Chipping

The extent of damage to the cut edge is measured by cutting the film on a paper cutter with the coated side up. The unsupported edge is viewed under magnification and the maximum distance from the edge of damage to the coating is measured in millimeters. This distance is measured in the first six inch length by dividing the six-inch length into three equal two-inch lengths and taking the average value of the three areas. Lower values indicate a better quality edge.

Results: From pilot plant run.

The samples were evaluated at the last six inches where cut was made where edge chipping was historically the worst.

| Ex. | Edge Weld Kral KU | Wedgie Test Kral KU | Wedgie Test mm. | Edge Chip mm. | |
|---|---|---|---|---|---|
| B1. | 0 | 1.75 | 23.5 | 0.57 | Standard |
| B2. | 5* | 0 | 0 | 0.23 | first core shell |
| 1. | 0** | 0 | 0 | 0.39 | |

*soft core tended to cold flow into adjacent sheets during cutting of a stack
**harder core (X linker increased Tg)
K.U is the scholastically valued Kral units of 0–6 wherein 0 is best; 6 is worst)

| RAW MATERIALS | |
|---|---|
| Description | Vendor |
| Tetronic 701-surfactant | BASF Co. |
| Surfynol SE-F-surfactant | Air Products Co. |
| Synthemul 97603 latex methylmethacrylate-n-butylacrylate-n-methylolacrylamide | Reichhold Co. |
| Synthemul 40440 latex methylmethacrylate-n-butylacrylate-n-methylolacrylamide | Reichhold Chemicals, Inc. |
| 10.5 micron PMMA beads | 3M Co. |
| 12 micron PMMA beads | 3M Co. |

EXAMPLE 2

| Core/Shell Latex Composition: | | | | | |
|---|---|---|---|---|---|
| MMA/EA/HDDA/NMA/Uvinul 3050/Uvitex OB | | | | | |
| Core | 15 | 85 | 5.8 | 0 | 2.0 | 0.2 |
| Shell | 56 | 39 | 0 | 5 | 2.0 | 0.2 |

Core/Shell: 50/50
Surfactant: DowFax 2A1 3.0% active based on Monomers.
Solids: 42%

| Recipe: | Raw Material Name | Amount (grams) | Function |
|---|---|---|---|
| | DI Water | 2060.2 | Dispersant |
| | DowFax 2A1 | 107.7 | Emulsifier |
| Core Monomer | | | |
| | MMA | 121.1 | Monomer |
| | EA | 686.5 | Monomer |
| | HDDA | 46.8 | Crosslinker |
| | Uvinul 3050 | 17.1 | UV absorber |
| | Uvitex OB | 1.7 | Optical Brighter |
| Shell Monomer #1 | | | |
| | MMA | 420.0 | Monomer |
| | EA | 347.3 | Monomer |
| | Uvinul 3050 | 15.3 | UV absorber |
| | Uvitex OB | 1.5 | Optical Brighter |

| Recipe: | Raw Material Name | Amount (grams) | Function |
|---|---|---|---|
| Shell Monomer #2 | | | |
| | NMA | 84.1 | Monomer |
| | DI Water | 211.2 | Diluent |
| | (NH4)2S2O8 | 4.8 | Initiator |
| | NH4OH | 2.1 | Neutralization |
| | DI Water | 3.9 | Diluent |

DowFax 2A1: 45% active in water
MMA: Methyl Methacrylate
EA: Ethyl Acrylate
NMA: N-Methylol Acrylamide, 48% active in water
HDDA: 1,6 Hexane Diol Diacrylate Procedure:

To prepare the present core/shell latex adhesives Containing UV Absorber and Optical Brightener, deionized water and surfactant, Dowfax 2A1,are added into a four-neck flask equipped with a reflux condenser, thermometer, stirrer, metering pumps and a nitrogen gas inlet. The water and surfactant mixture is then stirred and heated to 55° C. under nitrogen atmosphere. During heating up, the Uvinul 3050 and Uvitex OB are dissolved in the core monomers of MMA, EA and HDDA mixture. The monomer mixture is then charged into the reactor. When the batch temperature levels off at 55° C., the initiator, (NH4)2S2O8, is added into the reactor to initiate the polymerization. The reaction is allowed to exotherm. At the exotherm peak, the shell monomer mixture #1 (MMA, EA, Uvinul 3050 and Uvitex OB mixture) and the shell monomer mixture #2 (NMA and DI Water mixture) are simultaneously fed into the reaction using two metering pumps. The shell monomer feeds are completed for 70 minutes. After the peak temperature, the batch temperature set point is changed to 70° C. for the rest of the polymerization. When the shell monomer feeds are finished, the emulsion is polymerized for another two hours at 70° C. to eliminate residual monomers. The latex is then cooled to room temperature and filtered through a 25 μm filter to remove coagulum. The latex is then ready for application.

The examples show the dissolving of the UV absorbers and optical brighteners into the monomer compositions used to form the cores and shells of the core/shell latex thermal adhesives of the present invention.

Other useful UV absorbers include

1. Cyagard U,V,-24 from Cytex Industries
Structure

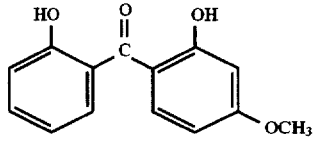

2,2'Dihydroxy-4-methoxybenzophenone

2. Cyagard ® UV-2337

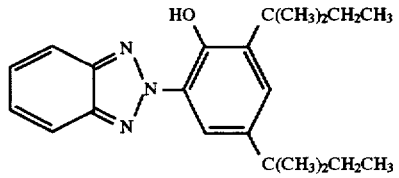

-continued 2-(2-Hydroxy-3,5-di-tert-amylphenyl)benzotriazole

What is claimed:

1. A photosensitive proofing element comprising a carrier layer, a release layer, a colored photosensitive resist layer(s), a barrier layer, and an adhesive layer, wherein said adhesive layer is formed by coating a film forming core/shell latex adhesive comprising a thermally softenable polymeric shell having a Tg of greater than 20° C. and a thermally softenable, crosslinked polymeric core having a Tg of less than 20° C., the difference between the Tg of the core and the shell being at least 10° C.

2. A photosensitive proofing element comprising a carrier layer, a release layer, a colored photosensitive resist layer(s), a barrier layer, and an adhesive layer, the adhesive layer formed from a thermally activated adhesive composition comprising:

a) from about 50 to 100 parts of a transparent film-forming core/shell latex polymer, wherein the ratio of core to shell of said core/shell latex polymer ranges from about 20/80 to about 80/20, the shell having a Tg above 20° C. and the core having a Tg below 20° C. with the core having a Tg lower than the Tg of the shell by at least 10°C;

b) from about 0 to about 15 parts inorganic, wax or polymeric particles;

c) from zero to about fifteen percent of optical brightening agents;

d) from zero to fifteen percent ultraviolet radiation absorbers;

e) and from 0 to 40% by weight non-core-shell polymeric latex, the total of b), c), d), and e) being less than fifty percent.

3. The element of claim 2 which is a negative acting color proofing element comprising, in order:

(a) releasable carrier;

(b) a photosensitive color coating comprising:

(i) a photopolymerizable oligomer having the formula:

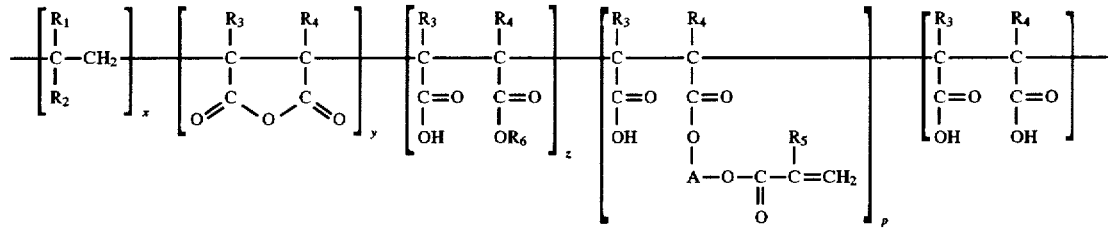

wherein:

$R_1$ and $R_2$ are the same or different groups and are selected from the group consisting essentially of hydrogen, alkyl containing from 1 to 20 carbon atoms, aryl containing from 6 to 10 carbon atoms, alkaryl containing from 7 to 14 carbon atoms, cycloalkyl containing from 4 to 12, and halogen;

$R_3$, $R_4$ and $R_5$ are the same or different groups and are selected from the group consisting of hydrogen and alkyl of from 1 to 5 carbon atoms;

$R_6$ is the same or different group selected from the group consisting of hydrogen, alkyl, aralkyl, and alkyl substituted aralkyl groups containing from 1 to 20 carbon atoms, and oxyalkylated derivatives of such groups containing from 2 to 4 carbon atoms in each oxyalkylene group, which group may be from 1 to 20 repeating units;

A is a linear or branched divalent alkylene of from 1 to 20 carbon atoms or an oxyalkylated derivative thereof as described in connection with $R_6$;

subscripts x, y, z, m and p are each whole numbers such that the sum of x, y, z, m and p may range from 3 to about 20; x, p and y are each equal to or greater than 1; m may be 0; and z may be 0;

said oligomer having an acid number of 100 to 250 and a number average molecular weight of at least 1,000;

(ii) a polymerizable compound having a plurality of pendant ethylenically unsaturated polymerizable groups and a weight average molecular weight of 400 to 1,500;

(iii) a colorant; and (iv) a photoinitiator;

(c) a photopolymerizable barrier coating; and (d) said adhesive layer.

4. The element of claim 3 wherein said core comprises a polymer derived from:

1) i) about 90 to 100 parts of at least one α, β-ethylenically unsaturated monomer having from about 1 to about 12 carbon atoms;

ii) greater than 0 up to 100 parts of at least one polyethylenically unsaturated crosslinking monomer; and 2) a shell formed from:

i) about 85 to 99 parts of at least one α, β-ethylenically unsaturated monomer having from about 1 to about 12 carbon atoms; and ii) 1 to about 15 parts of at least one polar monomer.

5. A photosensitive proofing element comprising a carrier layer, a release layer, a colored photosensitive resist layer(s), a barrier layer, and an adhesive layer, the adhesive layer comprising an adhesive layer formed by the coating of a thermally activated adhesive composition comprising:

a) from about 50 to 100 parts of a transparent film-forming core/shell latex polymer, wherein the ratio of core to shell of said core/shell latex polymer ranges from about 20/80 to about 80/20, the shell having a Tg above 20° C. and the core having a Tg below 20° C. with the core having a Tg lower than the Tg of the shell by at least 10°C;

b) from about 0 to about 15 parts inorganic, wax or polymeric particles;

c) and from 0 to 40% by weight non-core-shell polymeric latex.

6. The proofing element of claim 5 in which said core shell latex adhesive composition contains from 0.5 to 15% by weight of UV absorber.

7. The proofing element of claim 6 wherein said core comprises a polymer derived from:

i) 90 to 100 parts of at least one α, β-ethylenically unsaturated monomer having from about 1 to 12 carbon atoms;

ii) greater than 0 up to 10 parts of at least one polyethylenically unsaturated crosslinking monomer; and 2) a shell formed from:

i) 85 to 99 parts of at least one α,β-ethylenically unsaturated monomer having from 1 to about 12 carbon atoms; and ii) 1 to about 15 parts of at least one polar monomer.

8. The proofing element of claim 5 in which said core/shell latex adhesive has dissolved therein from 0.1 to 15% by weight of UV absorber.

9. The proofing element of claim 8 in which said core/shell latex adhesive has dissolved therein from 0.05 to 15% by weight of optical brightener.

10. The proofing element of claim 8 wherein said core comprises a polymer derived from:

i) about 90 to 100 parts of at least one α, β-ethylenically unsaturated monomer having from about 1 to about 12 carbon atoms;

ii) greater than 0 up to 10 parts of at least one polyethylenically unsaturated crosslinking monomer; and 2) a shell formed from:

i) about 85 to 99 parts of at least one α, β-ethylenically unsaturated monomer having from about 1 to about 12 carbon atoms; and ii) about 1 up to 15 parts of at least one polar monomer.

11. The proofing element of claim 5 in which said core/shell latex adhesive has dissolved therein from 0.05 to 15% by weight of optical brightener.

12. The proofing element of claim 5 wherein said core comprises a polymer derived from:

i) about 90 to 100 parts of at least one α, β-ethylenically unsaturated monomer having from about 1 to about 12 carbon atoms;

ii) greater than 0 up to 10 parts of at least one polyethylenically unsaturated crosslinking monomer; and 2) a shell formed from:

i) about 85 to 99 parts of at least one α, β-ethylenically unsaturated monomer having from about 1 to about 12 carbon atoms; and ii) about 1 to about 15 parts of at least one polar monomer.

* * * * *

UNITED STATES PATENT AND TRADEMARK OFFICE
CERTIFICATE OF CORRECTION

PATENT NO.: 5,776,651
DATED: July 7, 1998
INVENTOR(S): Lu et al.

It is certified that errors appear in the above-identified patent and that said Letters Patent is hereby corrected as shown below:

Col. 1, line 9, "adhesives" should be --adhesive--.

Col. 1, line 54, "cat.able" should be --capable--.

Col. 2, line 54, "monomers" should be --monomer--.

Col. 3, line 6, "adhesives" should be --adhesive--.

Col. 5, line 22, "10,000, an" should be --10,000, and most preferably 1,000 to 5,000--.

Col. 12, line 41, "Al" should be --All--.

Col. 14, line 11, "thereof Specific" should be --thereof. Specific--.

Col. 15, line 9, "poly(tetrafluorethylene)" should be --poly(tetrafluoroethylene)--.

Col. 17, line 44, "prepared" should be --prepare--.

Col. 17, line 45, "Example 1, deionized" should be --Example 1, deionized--.

Col. 20, line 9, "(NH4)2S2O8" should be --(NH$_4$)$_2$S$_2$O$_8$--.

Col. 20, line 10, "NH4OH" should be --NH$_4$OH--.

Col. 20, line 20, "Dowfax 2A1,are" should be --Dowfax 2A1, are--.

Col. 20, line 28, "(NH4)2S2O8" should be --(NH$_4$)$_2$S$_2$O$_8$--.

Col. 21, line 46, there should be an "m" at the bottom right side of the last bracket in the formula.

Signed and Sealed this

Twenty-sixth Day of October, 1999

Attest:

Q. TODD DICKINSON

*Attesting Officer*   *Acting Commissioner of Patents and Trademarks*